United States Patent [19]

Takagi et al.

[11] 3,767,484

[45] Oct. 23, 1973

[54] METHOD OF MANUFACTURING SEMICONDUCTOR DEVICES

[75] Inventors: Sadaaki Takagi; Masamichi Yoshida, both of Kawasaki, Japan

[73] Assignee: Fujitsu Limited, Kawasaki-shi, Japan

[22] Filed: Oct. 6, 1971

[21] Appl. No.: 186,970

[30] Foreign Application Priority Data

Oct. 9, 1970 Japan ................................ 45/88967

[52] U.S. Cl. .................. 148/188, 148/186, 148/187, 148/191, 317/235 R, 252/62.3 E, 29/571

[51] Int. Cl. ................................................ H01l 7/36

[58] Field of Search .................... 148/191, 187, 188; 317/235 B; 252/62.3 E; 29/571

[56] References Cited

UNITED STATES PATENTS

| | | | |
|---|---|---|---|
| 3,574,010 | 4/1971 | Brown | 148/187 |
| 3,640,782 | 2/1972 | Brown et al. | 148/187 |
| 3,306,788 | 2/1967 | Sterling et al. | 148/187 X |

*Primary Examiner*—G. T. Ozaki
*Attorney*—Arthur E. Wilfond et al.

[57] ABSTRACT

A method of manufacturing a semiconductor device which comprises: forming an oxide film containing an impurity on one surface of a semiconductor substrate; forming an oxidation preventing film on the portion of the oxide film above the region of said substrate into which the impurity is to be diffused; and heating the substrate in an oxidizing atmosphere containing steam to diffuse the impurity into only the region.

3 Claims, 3 Drawing Figures

METHOD OF MANUFACTURING SEMICONDUCTOR DEVICES

The present invention relates to a method of manufacturing semiconductor devices and more particularly relates to a solid-to-solid diffusion method to selectively diffuse an impurity into a semiconductor using a glass film containing the impurity as the source of diffusion, without using a diffusion mask.

Silicon transistors and integrated circuits are manufactured today by the planar process, and the selective diffusion is accomplished by the use of a silicon dioxide layer, formed by the thermal oxidation of a silicon substrate, as a diffusion mask. This selective diffusion will be explained. A diffusion mask of silicon dioxide is formed on the surface of a silicon substrate by the thermal oxidation of the substrate. A diffusion window is then opened by the photo etching. The silicon substrate is then placed in a gaseous phase reaction furnace and is heated, whereby phosphorus or boron as an impurity is deposited as a pure oxide layer. In this process, the phosphorus or boron is partly diffused into silicon. Prior to the final diffusion, the oxide layer deposited on the surface of silicon is removed by etching, leaving the required amount of impurity on the surface of silicon. If the etching treatment is not complete, the oxide is left on the surface of silicon prior to the deposition of the impurity, or the oxide is not uniform, the sheet resistivity of the diffusion layer is very markedly varied. Further, the impurity left on the surface of silicon arrives at the solid solubility and many dislocations take place. The desired diffusion layer can be formed by the diffusion of the above-mentioned required amount of impurity. This running process is performed in an atmosphere of oxygen, which has been passed through a warm water. A protective film of silicon dioxide is formed in the same process on the surface of the diffusion layer. When another diffusion is to be effected into the diffusion layer, the protective film must be made of a thickness satisfactory to serve as the mask for said another diffusion. But this protective film and the diffusion mask used previously, have a difference in thickness. This unevenness of the surface causes the lowering of the reliability due to disconnections and short circuits in performing the wiring or multilayer wiring on the semiconductor substrate.

The defect of the selective diffusion method using the oxide film described above can be eliminated by the solid-to-solid diffusion method which utilizes an oxide layer containing the impurity to be diffused as the source of diffusion. In this method, impurity concentration within the oxide layer can be controlled over a wide range, so that control of the surface concentration of the diffusion layer can be facilitated. The diffusion at a lower temperature is also made possible. This oxide layer is usually left unetched during the diffusion treatment within a nitrogen atmosphere and therefore the process of this method can simplified compared with the selective diffusion method. A method of effecting the selective diffusion in this solid-to-solid diffusion method is to leave the oxide layer on the desired surface part of silicon, but usually silicon dioxide is used as the diffusion mask to achieve the final protection of the semiconductor device. Thus, it is necessary to provide a suitable diffusion mask by some method or other in the selective diffusion of an impurity.

The invention hereof presents a novel method of selective diffusion of an impurity in a solid-to-solid diffusion method, without the use of a diffusion mask.

Generally speaking, according to the present invention, an oxide film containing an impurity is formed on a surface of a semiconductor substrate. An oxidation preventing film is then formed on the portion of the oxide film above the region of the semiconductor substrate into which the impurity is to be selectively diffused, and the substrate is then heated in an oxidizing atmosphere containing steam, whereby the impurity can be diffused selectively into only said region. According to this invention, a diffusion mask of silicon dioxide or silicon nitride is not formed on the semiconductor substrate but the diffusion source used in the solid-to-solid diffusion, i.e., the oxide film containing the impurity to be diffused is directly coated. An oxidation preventing film is formed on the portion of the oxide film above the region of the semiconductor substrate into which the impurity is to be selectively diffused. The semiconductor substrate is then heated in an oxidizing atmosphere containing steam. In this heat treatment, the impurity is diffused into the semiconductor. But oxygen is diffused from the surface of the portion of the oxide film on which the oxidation preventing film is not provided. In this portion, the diffusion of oxygen precedes so that the impurity is not diffused and only oxidation takes place. The oxidation preventing film prevents the out-diffusion of the impurity from the oxide film, also prevents the oxidation of the semiconductor preceding the diffusion of the impurity and completes the diffusion with the desired surface concentration. The impurity is diffused to the outside from the portion of the oxide film on which no oxidation preventing film is provided. It has been confirmed that an oxidizing atmosphere containing steam extracts more impurity compared to a nitrogen atmosphere. Therefore, after the diffusion process is finished, more impurity remains in the portion of the oxide film beneath the oxidation preventing film and less impurity remains in the portion of the oxide film on which no oxidation preventing film is formed.

When the semiconductor is silicon, the surface of silicon on which the oxidation preventing film is not provided is protected by the newly formed silicon dioxide layer. When the main constituent of the oxide film is silicon dioxide, the silicon surface is protected by silicon dioxide in which less impurity remains. When the main constituent of the oxide film is silicon dioxide and the impurity is boron, the oxide film beneath the oxidation preventing film cannot be removed by the dipping of the silicon substrate in an oxide film etching liquid after the diffusion process. The oxide film, however, can be removed by the same etching treatment when the impurity is phosphorus because the etching rate of silicon dioxide containing phosphorus rises rapidly with the increase of the phosphorus concentration.

A second diffusion layer can be provided in the first diffusion layer in the following manner, namely, after the first diffusion is finished, the oxide film on the surface of the semiconductor is entirely removed. A new oxide film containing an impurity is then coated on the surface of the semiconductor. An oxidation preventing film is coated on the region into which the impurity is to be selectively diffused. The substrate is then heated in an oxidizing atmosphere containing steam to selectively diffuse the impurity. In some cases, a diffusion mask of silicon dioxide is formed on the surface of the semiconductor including the surface of the first diffusion layer, but not on the surface of the second diffusion layer, and then the oxide film containing the impurity is coated. The diffusion of the impurity is effected by nitrogen in a hydrogen and oxygen atmosphere.

The oxidation preventing film used in this invention need not completely prevent the permeation of oxygen into the semiconductor. It is only required to substantially prevent the oxidation of the semiconductor, under the oxidation preventing film and allow the diffusion of the impurity contained in the oxide film. For this purpose, an insulating film such as silicon nitride or aluminum oxide or a metal film such as silicon, chromium, tungsten, molybdenum or nickel is used as the oxidation preventing film. Heretofore, it has been absolutely necessary to use a diffusion mask for the selective diffusion of the impurity. The present invention has eliminated the need for the use of the diffusion mask by the provision of a novel selective diffusion method in the solid-to-solid diffusion method using an oxide film containing the impurity as the source of diffusion. In the prior art, the thermal oxidation process for the formation of the diffusion mask of silicon dioxide sometimes causes the redistribution of the impurity contained in the diffusion layer previously formed, but this defect can be eliminated by the method of this invention.

Moreover, according to the present invention, a new silicon dioxide film, for protecting the surface of silicon, can be formed close to silicon in the selective diffusion process. This film can be used as the final protective film for the semiconductor device. Other characteristic features and effects of this invention will become evident from the following descriptions of experiments and embodiments.

The invention is not intended to be limited to the details shown, since various modifications may be made therein within the scope and the range of the claims. The invention, however, together with additional objects and advantages will be best understood from the following description and in connection with the accompanying drawings, in which:

FIG. 1 is the sectional view of a silicon substrate on which a borosilicate glass has been coated and then silicon nitride has been selectively coated;

FIG. 2 is the sectional view of the silicon substrate of FIG. 1 into which the impurity has been diffused, according to the present invention; and FIG. 3 is the sectional view of the silicon substrate of FIG. 2 on which resists have been coated to remove the borosilicate glasses on the portions where gate oxide films are to be formed.

Figure 1:
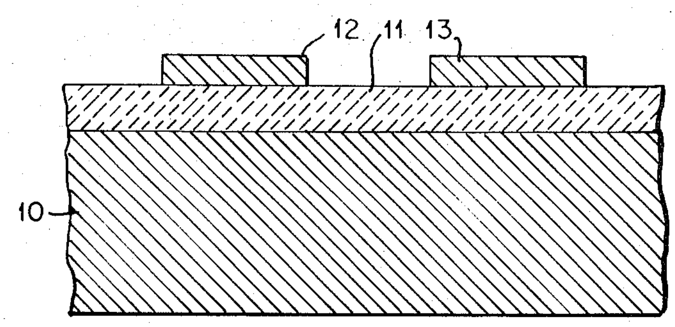
FIGS. 1 to 3 are sectional views of a semiconductor substrate in the manufacturing process of a MOS transistor, according to the present invention.

Referring now to FIG. 1, 10 is an N type silicon substrate with a specific resistance of 0.3Ωcm, on one surface of which a borosilicate glass film 11 containing boron, which is the impurity to be diffused, is coated to a thickness of 2,500 A. This glass film 11 is formed by gaseous phase reaction of monosilane $SiH_4$, diborane $B_2H_6$ and oxygen. Monosilane and diborane are both led, from a bomb diluted by argon, to the gaseous phase reaction furnace with the carrier gas of nitrogen. The flow rate of diborane is 1 vol-percent of the total amount of diborane and monosilane. Oxygen is introduced into the reaction furnace at a flow rate equal to 20 times of the flow rate of monosilane. The reaction temperature is 450°C. After the glass film 11 is formed, silicon nitride films 12, 13 are formed selectively to a thickness of 1,500 A on the regions, on which the source and drain of an insulated gate field effect transistor are to be formed. These silicon nitride films can be formed by the well known method. The forming temperature of a silicon nitride film in this time shall be a temperature lower above about 100°C than the following diffusion temperature, or about 1,000°C, or less. It is because of prevention of the diffusion of impurity that the silicon nitride film is formed at such a temperature. Namely, silicon nitride is coated on the entire surface of glass film 11 by the gaseous phase reaction of monosilane and ammonia and then silicon dioxide is coated on the silicon nitride by the gaseous phase reaction of monosilane and oxygen. This silicon dioxide is partially removed leaving silicon dioxide of the pattern identical to the pattern of the silicon nitride to be left. Using this silicon dioxide as the mask, silicon nitride is removed by boiling phosphoric acid. Lastly the silicon dioxide mask is removed by hydrofluoric acid. The diffusion treatment is then effected. The silicon substrate is placed into a quartz tube and heated at the diffusion temperature of 1,100°C. Oxygen gas, which has been passed through water heated to 98°C, is flowed into the quartz tube. Various results, as shown in the following Table, can be obtained by varying the diffusion time.

TABLE

| Diffusion Temp. (°C) | Diffusion Time (min) | Water Temp. (°C) | Sheet Resistivity (Ω /cm) | Depth of Junction (A.) | Specific resistance of portion of substrate on which no silicon nitride film is formed (ohm cm) |
|---|---|---|---|---|---|
| 1100 | 20 | 98 | 139–144 | 6000 | 0.31–0.32 |
| 1100 | 40 | 98 | 94.2–98.1 | 9000 | 0.31 |
| 1100 | 60 | 98 | 65–67 | 15000 | 0.3–0.31 |

Thus, the surface of the portion of the silicon substrate, on which the silicon nitride film is provided, has the inverted conduction type while the specific resistance of the portion of the substrate on which no silicon nitride is provided remains unchanged and the selective diffusion is possible.

Figure 2:
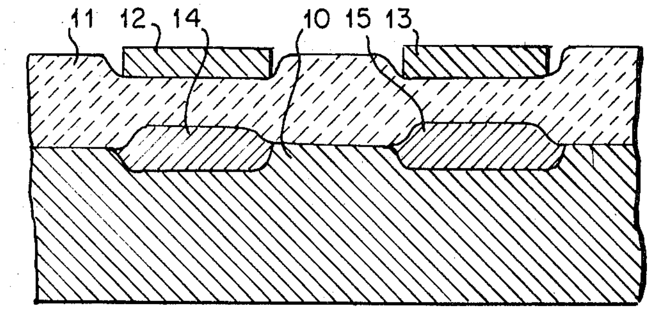
Figure 3:
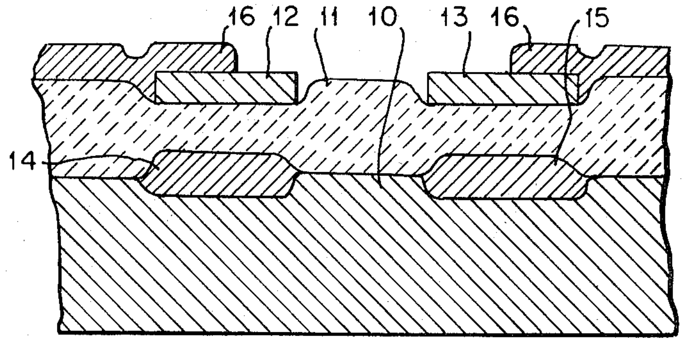

FIG. 2 is the sectional view of the silicon substrate in which the diffusion is completed. Source 14 and drain 15 are formed under silicon nitride films 12 and 13. The boron diffusion layer protrudes, as shown in the drawing, because the diffusion is effected in an oxidizing atmosphere containing steam at a high temperature and the oxidation speed is high. This is due to the oxidation of silicon during the diffusion treatment. The out-diffusion from the portion of glass film 11 not covered by silicon nitride is expedited by the use of the atmosphere containing steam, with the result that only a very small amount of boron remains in glass film 11. This glass film 11 can be substantially regarded as a pure silicon dioxide film. Needless to say, a pure silicon dioxide formed in the diffusion process and closely bonded to silicon is present in the interface, between the above-mentioned glass film 11 and silicon. The semiconductor device can be protected by this pure silicon dioxide layer. After the source and the drain are formed, a thin gate oxide film is formed. Silicon nitride films 12 and 13 are usable as a part of the etching mask of glass film 11 and this can be regarded as what is called the self-alignment. Then, as shown in FIG. 3, resist layer 16 is coated. The glass film on the portion, on which the gate oxide film is to be formed, is removed by the etching treatment. A new gate insulation film is formed by thermal oxidation and, next the silicon nitride films 12 and 13 are removed by etching and the glass layer is left. Thereafter, the conventional method is applied and thus a P-channel MOS transistor can be manufactured.

P-channel MOS transistors having a different characteristic from the above transistor could be manufactured in the following manner: Two lots of N-type silicon substrate with a specific resistance of 0.3Ωcm were prepared and borosilicate glass films were coated on the surfaces of these substrates to a thickness of 2,000 A. As in the first embodiment, this glass film can be formed by the gaseous phase reaction of monosilane, diborane and oxygen, the flow rate of diborane being 1 percent of the total flow rate of diborane and monosilane. The reaction temperature was controlled to 450°C. As in the first embodiment, silicon nitride films were formed on the glass film in the regions where the source and drain are to be formed. Therefore, the silicon nitride film will be formed at optional temperatures of about 900°C or less for substrates of the first lot and about 1,000°C or less for substrates of the second lot. The thickness of this silicon nitride film was 2,000 A. Boron was diffused into the silicon substrate of the first lot for 30 minutes at 1,000°C and also boron was diffused into the substrate of the second lot for 45 minutes at 1,100°C. During the diffusion treatment, both silicon substrates were exposed to an atmosphere of oxygen gas which had been passed through water held to 90°C. The section of the silicon substrate into which boron has been diffused, is as shown in FIG. 2, that is boron was diffused to only the portion of the silicon substrate under the silicon nitride and not diffused to the other portion of the substrate. Sheet resistivity of the surface of the portion of silicon to which boron had been diffused was 177Ω in the first lot and 107Ω in the second lot. The depth of diffusion was 0.8 $\mu$ in the first lot and 1.02 $\mu$ in the second lot. The above-mentioned silicon nitride film used in the diffusion treatment can be used as the etching mask as shown in FIG. 3. Then, as in the former embodiment, gate insulation films were formed by thermal oxidation and thus P-channel MOS transistors were manufactured.

An N-channel MOS transistor can be manufactured by using a P-type silicon substrate and using a phosphosilicate glass film instead of the borosilicate glass film. In this case, molybdenum or tungsten should be used instead of silicon nitride as the oxidation preventing film because silicon nitride delays the diffusion of phosphorus. The patterning of molybdenum can be achieved by means of chemical etching using diluted nitric acid and the patterning of tungsten is also possible by the use of known appropriate etching liquid.

What is claimed is:

1. A method of manufacturing a semiconductor device, comprising the steps of:

a. forming an oxide film containing boron or phosphorous on the entire surface of a silicon substrate;
b. forming a silicon nitride film on the portion of said oxide film above the region of said substrate into which said boron or phosphorous is to be diffused; and
c. heating said substrate in an oxidizing atmosphere containing steam to diffuse said boron or phosphorous into only said region.

2. A method of manufacturing an insulated gate field effect transistor, comprising the steps of:

a. forming an oxide film containing boron or phosphorous on one surface of a silicon substrate;
b. forming silicon nitride films on the portion of said oxide film above the regions of said substrate in which a source and a drain are to be formed; and
c. heating said substrate in an oxidizing atmosphere containing steam to form the source and the drain.

3. The method of claim 2, having the additional steps of removing said oxide film between the source and drain by the use of said silicon nitride films as the mask for chemical etching and forming a gate insulation film on the exposed silicon surface between the source and drain.

* * * * *